United States Patent [19]

Sandow

[11] Patent Number: 5,288,650
[45] Date of Patent: Feb. 22, 1994

[54] PRENUCLEATION PROCESS FOR SIMOX DEVICE FABRICATION

[75] Inventor: Peter M. Sandow, New Market, N.H.

[73] Assignee: Ibis Technology Corporation, Danvers, Mass.

[21] Appl. No.: 960,193

[22] Filed: Oct. 9, 1992

Related U.S. Application Data

[63] Continuation of Ser. No. 646,143, Jan. 25, 1991, abandoned.

[51] Int. Cl.$^5$ ............................................. H01L 21/76
[52] U.S. Cl. ........................................ 437/24; 437/25; 437/26; 437/27; 437/62; 437/247
[58] Field of Search ............... 437/24, 247, 25, 26, 437/27, 62; 148/DIG. 3, DIG. 76, DIG. 83, DIG. 86

[56] References Cited

U.S. PATENT DOCUMENTS

| | | | |
|---|---|---|---|
| 3,855,009 | 12/1974 | Lloyd et al. | 148/1.5 |
| 4,749,660 | 7/1988 | Short et al. | 437/24 |
| 4,786,608 | 11/1988 | Griffith | 437/24 |
| 4,975,126 | 6/1988 | Margail et al. | |

FOREIGN PATENT DOCUMENTS

| | | | |
|---|---|---|---|
| 0208577 | 1/1987 | European Pat. Off. | 437/27 |
| 2098794 | 1/1989 | European Pat. Off. | |
| 61-185923 | 8/1986 | Japan | 437/27 |
| 62-29637 | 12/1987 | Japan | 437/24 |
| 63-217657 | 9/1988 | Japan | 437/27 |
| 1-37835 | 2/1989 | Japan | 437/24 |

OTHER PUBLICATIONS

Wolf, S., *Silicon Processing for the ULSI Era*, vol. 2 ©1990, pp. 72-75.
Hemment, P. et al., *Instruments and Methods in Physical Research*, vol. B39, pp. 210-214 (1989), Nucleation and Growth of SiO$_2$ ....
Jastczebski, L., et al., "The Effect of 1300-1380° C. Annual . . . CMOS/SIMOX Devices", IEEE Electron Device Letters, vol. 9, No. 3, Mar. 1988, pp. 151-153.
Brady, F., et al., "C-V and C-t Analysis . . . Oxygen Implantation", Journal of Electronic Materials, vol. 18, No. 3, 1989, pp. 385-389.
Wolf, S., et al., *Silicon Processing for the VLSI Era*, vol. 1, pp. 303-307 ©1986.
Stoemenos et al., Appl. Phys. Lett., vol. 48, No. 21, pp. 1470-1472 (1986); SiO$_2$ Buried Layer Formation by ...

*Primary Examiner*—George Fourson
*Attorney, Agent, or Firm*—Thomas J. Engellenner

[57] ABSTRACT

A method of manufacturing SIMOX heterostructures is disclosed wherein a subcritical dose of oxygen ions is implanted following a first, short "nucleating" implant and a nucleation growth step. The SIMOX structure thus formed has a thin, buried oxide layer and sharp interfaces.

14 Claims, 1 Drawing Sheet

PRENUCLEATION PROCESS FOR SIMOX DEVICE FABRICATION

This application is a continuation of application Ser. No. 07/646,143, filed Jan. 25, 1991, now abandoned.

BACKGROUND OF THE INVENTION

The technical field of this invention is the implantation of ions into targets, such as silicon semiconductors, and, in particular, to improved methods for generating a silicon heterostructure having a discrete, continuous, buried dielectric layer which is, substantially free of defects.

Ion implantation techniques are particularly useful in forming a class of buried layer devices known as silicon-on-insulator (SOI) devices. In these devices, a buried insulation layer is formed beneath a thin surface silicon film. These devices have a number of potential advantages over conventional silicon devices (e.g., higher speed performance, higher temperature performance, reduced junction capacitance, and increased radiation hardness).

In one known technique, known by the acronym SIMOX, a very thin (0.1 micron–0.3 micron) layer of monocrystalline silicon is separated from the bulk of the silicon wafer by implanting a high dose of oxygen ions (e.g., up to about $3.0 \times 10^{18}$ oxygen ions/cm$^2$) into the wafer to form a buried dielectric layer of silicon dioxide ($SiO_2$ having a typical thickness ranging from about 0.1 micron to 0.5 micron). Assuming that a continuous amorphous dielectric layer can be formed, this technique of "separation by implanted oxygen" (SIMOX), provides a heterostructure in which a buried silicon dioxide layer serves as a highly effective insulator for surface layer electronic devices.

While SIMOX technology is proving to be one of the most promising of the SOI technologies, there are a number of problems still associated with the manufacturing of SIMOX materials, as practiced in the art. One particular problem is the high doses of oxygen ions that must be implanted to ensure that a continuous amorphous buried oxide region will be formed. Generally, ion implants on the order of $1.5 \times 10^{18}$ ions/cm$^2$ (the so-called "critical dose") are required to ensure formation of a continuous layer of silicon dioxide. Such high implant doses require undesirably long implantation protocols (four to six hours), which are expensive to perform, strain the implant apparatus, and increase the number of problems associated with ion implantation, such as static charge build up and/or introduction of heavy metal or carbon contaminants. In addition, the high implant dose can cause irrepairable damage to the silicon lattice overlying the dielectric layer, causing threading dislocations in the device. (A maximum defect density of about $10^5$ defects/cm$^2$ is considered acceptable for device-grade silicon). Finally, high doses can yield undesirably thick dielectric layers. The thicker the dielectric layer, the thinner the overlying silicon layer becomes, increasing the possibility of charge build-up within this layer, and reducing the radiation hardness aspects of the device.

A number of different methods for producing thinner buried oxide layers have been tried, using low (subcritical) implant oxygen ion doses (see, for example, Stoemenos et al. (1986) vol. 48, *Appl. Phys. Lett.* pp. 1470–1472; and Hemment et al., (1989) vol. B9, *Nuclear Instruments and Methods in Physics Research*, pp. 210–214). However, the resulting dielectric layers are generally discontinuous, containing an unacceptable number of silicon inclusions or silicon "islands" within the layer and at the upper interface with the overlying silicon, substantially reducing the effectiveness of the dielectric layer.

U.S. Pat. No. 4,749,660 (Short et al., filed Nov. 26, 1986), discloses a method of manufacturing SIMOX devices having "substantially homogeneous, relatively thin buried silicon dioxide layers". The method comprises implanting a subcritical dose of oxygen ions, followed by at least one "randomizing implant" (e.g., of silicon ions), and a low temperature annealing protocol. The effectiveness of this method is unknown, as no experimental data is provided.

EPO 298,794 (Margail, J. et al, filed Jun. 13, 1988), discloses a method of manufacturing SIMOX heterostructures having sharp interfaces, using a multiple implant protocol. The method involves implanting a total dose of at least $1.5 \times 10^{18}$ ions/cm$^2$ in a series of multiple partial implants using a constant beam energy and subjecting the wafer to a high temperature annealing protocol between each partial implant. The total ion dose implanted is not reduced, but the intermediate annealing steps are thought to reduce the build up of threading dislocations in the overlying silicon.

There exists a need for a novel method of manufacturing SIMOX heterostructures having thin buried oxide layers with sharp interfaces and which are substantially free of silicon islands. It is therefore an object of this invention to provide a method of manufacturing such SIMOX materials requiring lower oxygen ion doses and shorter implant protocols. Another object of this invention is to provide a method of manufacturing such materials which is rapid and cost efficient. Other features and objects of this invention will be apparent from the description, figures and claims which follow.

As used herein, "overlying silicon body" is understood to mean that portion of the silicon wafer (substrate) lying over the buried oxide layer, and on which the semiconductor device is to be built. "bulk silicon region" is understood to mean that portion of the silicon wafer (substrate) lying below the buried oxide layer. "Nucleation sites" are understood to mean localized regions of damage to the silicon lattice. "Silicon islands" and "silicon inclusions" are understood to mean isolated pockets of silicon. "Upper interface" and "lower interface", respectively, refer to the boundaries separating the buried oxide layer from the overlying silicon body and the underlying bulk silicon region. "Substantially free of silicon islands" is understood to mean a buried oxide layer sufficiently depleted in isolated pockets of silicon such that the performance of the insulating layer or the overlying device is not affected.

SUMMARY OF THE INVENTION

The method of this invention involves a first, short "nucleating" implant into a silicon substrate, using a subcritical dose of ions, and preferably implanted at a low temperature (e.g., less than about 450° C.) The nucleating implant is sufficient to damage the silicon lattice throughout the region that is to become the buried oxide layer. In a preferred embodiment of the invention, silicon nucleation "seed" regions then are induced to form within the damaged lattice, by any appropriate technique known in the art. The oxygen ions subsequently implanted are aided in their diffusion by the lattice damage, readily coalescing to form a continuous layer of silicon dioxide. Consequently, a lower (subcritical) dose of oxygen ions can be implanted. As a result, an improved continuous buried oxide layer now can be generated with a lower dose of oxygen ions and requiring a shorter implantation sequence.

The nucleating implant can comprise oxygen ions or other rapidly diffusing ions capable of damaging the crystal lattice, such as argon. Silicon also may be used. The nucleating implant dose may vary within the range of $10^{16}$ to $10^{17}$ ions/cm$^2$.

The nucleating implant temperature should be insufficient to allow the damaged silicon lattice to self-anneal, e.g., less than about 500° C. A currently preferred nucleating implant temperature is about 450° C.

The nucleating protocol may be by any of a number of means known in the art. The currently preferred protocol involves maintaining the wafer at a temperature within the range of about 800° C. for 10-20 hours, preferably 12-18 hours.

The silicon dioxide forming oxygen ions subsequently implanted are at a dose substantially below the known critical implant dose, generally within the range of $1 \times 10^{17}$ to $1 \times 10^{18}$ ions/cm$^2$. The currently preferred dose is about $0.5 \times 10^{18}$ ions/cm$^2$, approximately one-third of the so-called "critical implant dose", and reduces the ion implant time accordingly. Where an ion dose of $1.5 \times 10^{18}$ ions/cm$^2$ implanted at 200 keV would require 6 hours to implant, the currently preferred dose only requires 2 hours. The wafer is preferably maintained at a temperature within the range of 600°-750° C. during this implant to allow self-annealing of any lattice damage to the overlying silicon body.

The substrate then is subjected to a high temperature annealing protocol sufficient to dissolve any silicon dioxide precipitates that may persist in the overlying silicon body and to allow the buried free oxygen to redistribute, sharpening the interfaces separating the oxide layer from the silicon substrate. Annealing temperatures within the range of 1200°-1400° C. are known in the art. A currently preferred protocol involves annealing at 1300°-1350° C. for six hours. While annealing at higher temperatures may allow shorter annealing times, temperatures approaching the melting point of silicon (about 1412° C.) are generally not considered practical for production grade devices, due to the difficulty in maintaining the integrity of the silicon lattice at such high temperatures.

The ion beam energy chosen for the implants will depend on the desired characteristics of the ultimate SIMOX device. In general, heavier ions will require lower beam energies. Ion beam energies for oxygen ion implants may vary within the range of about 100-400 keV, preferably within the range of about 150-200 keV. In one preferred embodiment of this invention the oxygen ion beam energy is increased throughout the implant. The energy may be increased continuously, or in separate, discrete steps.

Buried oxide layers produced by the method of this invention yield SIMOX materials of superior quality, having thin continuous dielectric layers substantially free of silicon islands, and requiring both lower doses and shorter implantation times to produce.

DETAILED DESCRIPTION

Figure 1:
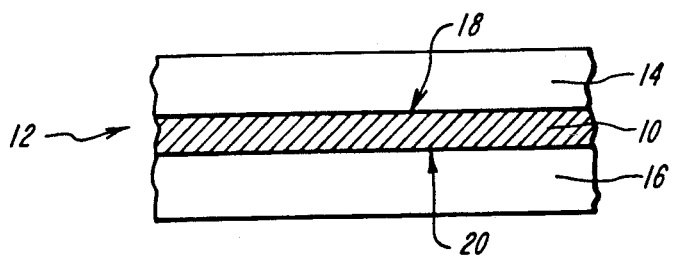
FIG. 1 is a schematic representation of a SIMOX wafer.

FIG. 1 schematically represents a SIMOX material of the type described herein. A silicon dioxide layer 10 is buried in a single crystal silicon wafer (substrate) 12, functionally isolating the overlying silicon body 14 on the surface of which the semiconductor device is to be built, from the underlying bulk silicon region 16. The upper and lower interfaces (18 and 20, respectively) are sharp and effectively isolate the dielectric layer from the surrounding silicon.

It is known that silicon dioxide layer formation involves two competing processes. It is also known that silicon dioxide layer formation is proportional to the rate of oxygen arrival and the number of nucleation sites.

The number of nucleation sites is a function of both the ion implant temperature and the number of regions that allow nucleation to occur, that is, the regions of localized disorder in the silicon lattice. Oxygen diffusion is enhanced by lattice damage, aiding the ions to coalesce into a continuous layer. Thus, the larger the number of nucleation sites, the lower the oxygen ion dose required to cause these local disordered regions to overlap and generate a continuous amorphous region.

The rate of oxygen migration to a nucleation site is a function of both the implant temperature and the oxygen ion concentration. Higher implant temperatures and beam currents therefore enhance this term. At the same time, the higher implant temperatures can be used to reduce the beam current and, therefore, the cost of implantation. However, high temperature implants (greater than 500° C.), are sufficient to allow the damaged silicon lattice to self-anneal. Thus, there is competition between the formation of the lattice damage (and therefore nucleation sites), and the self-annealing that takes place at these elevated temperatures. One reason for the high dose requirement of SIMOX devices of the art may be to overcome the continual annealing that competes with nucleation site formation.

The method of this invention is directed to enhancing the number of useful nucleation or "seed regions" in the SIMOX area, where the oxygen implantation can adhere to and eventually become a continuous oxide layer following a high temperature annealing protocol, thereby speeding up the rate of formation of the buried oxide layer.

In the method of this invention the number of nucleation sites are increased by pre-implanting a foreign species at a low level to form a high degree of lattice damage in the region to become the buried oxide layer. By implanting the ions at a low temperature, self-annealing of the damaged lattice is substantially reduced. The region of damaged lattice then can be induced to expand to form a region of nucleation sites, preferably by an appropriate thermal process. The object is to localize a significant number of nucleation sites and to control the dynamics in such a way that the nucleii grow rather than dissolve. Subsequent implantation of oxygen ions at the higher implantation temperature then will be enhanced by ion-assisted diffusion, speeding up the rate of SIMOX formation within the layer.

A variety of different foreign ion species may be used as the nucleating implant species. Preferred ions are foreign species that diffuse rapidly, such as oxygen or argon. Alternatively, silicon also may be used. The nucleating implant temperature should be low enough to prevent significant self-annealing to occur within the overlying silicon lattice. A nucleating implant temperature of about 450° C. is currently preferred.

The ion dose and ion beam energy chosen for the nucleating implant will depend on the ion species used and on the desired characteristics of the ultimate SIMOX device. In general, a heavier ion will require a lower dose to be implanted to the same depth as a lighter ion.

Figure 2:
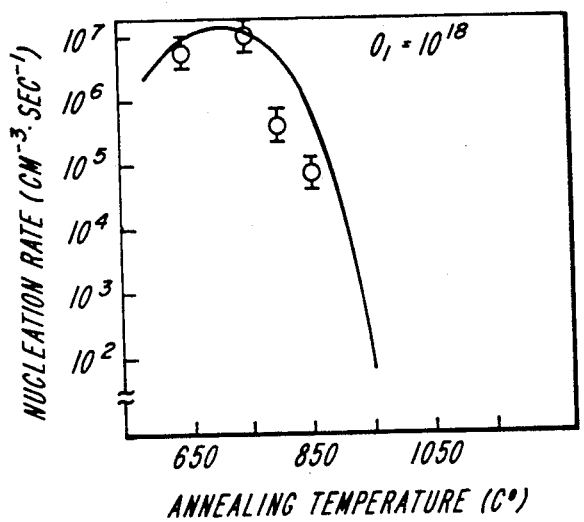
FIG. 2 is a graph plotting the nucleation rate as a function of annealing temperature, for an implant dose of $10^{18}$ oxygen ions/cm$^2$.
Figure 3:
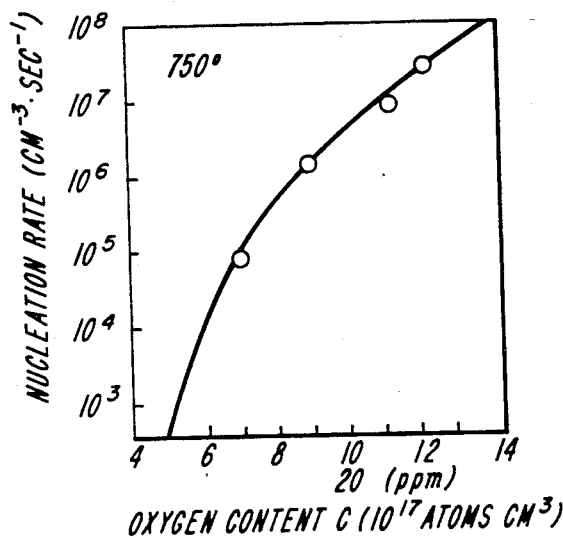
FIG. 3 is a graph plotting the nucleation rate as a function of oxygen content, for an annealing temperature of 750° C.

The wafer is then preferably subjected to a nucleation protocol using any of a number of means known in the art. The currently preferred protocol is a "nucleation anneal" at a temperature within the range of about 700°–800° C. for about 10–20 hours. FIG. 2 shows that a maximum in nucleation rate of oxygen precipitate sites occurs at about 750° C. Moreover, as shown in FIG. 3, it has been discovered that the nucleation rate increases dramatically with increases in the oxygen content if an initial nucleation anneal is performed at about 750° C. For example, increasing the oxygen content from $5 \times 10^{17}$ to $15 \times 10^{17}$ ions/cm$^2$ increases the nucleation rate by five orders of magnitude.

The subcritical oxygen ion implant that follows the nucleating implant preferably is carried out at a temperature that is high enough to ensure self-annealing of any damage to the overlying silicon lattice. Temperatures greater than about 550° C. are useful, with temperatures within the range of about 600°–750° C. being preferred.

As with the nucleating implant, the ion beam energy chosen for the oxygen ion implant will depend on the desired characteristics of the ultimate device. Preferred oxygen ion beam energies are within the range of 100–400 keV, most preferably within the range of 200 keV. The ion beam energy also may be increased throughout the implant step. The beam energy may be increased in discrete increments or in a continuous manner.

The method of this invention allows the formation of a thin, continuous oxide layer requiring lower doses and shorter implant times than previously have been achieved in the art. Useful SIMOX implant doses are within the range of about $1 \times 10^{17}$ to $1 \times 10^{18}$ ions per cm$^2$, preferably within the range of about $5 \times 10^{17}$ ions per cm$^2$. The reduced dose allows substantial reductions in implant times (on the order of 20–30% of implant times of the art).

A particular embodiment of the invention is described below to illustrate the method of the invention. However, it should be clear that various changes, additions and subtractions can be made by those skilled in the art without departing from the spirit or scope of the invention.

EXAMPLE

In this example, device grade single crystal (100) silicon wafers appropriately cleaned and/or otherwise prepared, were subjected to a nucleating implant of oxygen ($10^{16}$ ions/cm$^2$), at a temperature of about 450° C., for about 15 minutes at 200 keV. This short, nucleating implant was sufficient to substantially damage the silicon lattice, and the low implant temperature prevented significant self-annealing.

Nucleation sites then were induced by maintaining the wafer at a temperature of about 800° C. for approximately 20 hours.

A dose of $0.5 \times 10^{18}$ oxygen ions/cm$^2$ was then implanted at an implant temperature within the range of 700°–750° C., for about two hours. The ion beam energy was kept constant at 200 keV.

The oxygen ions were implanted using a multiple beam apparatus such as is described in U.S. Pat. Application Ser. No. 487,597, now U.S. Pat. No. 5,053,627 the disclosure of which is hereby incorporated by reference. Alternatively, a single beam apparatus such as is known in the art could be used to implant the oxygen ions. However, the reduced current beam densities afforded by the multiple beam device substantially reduces the number of problems associated with the use of a single beam apparatus of the art (e.g., static charge build-up).

Upon completion of the implant protocol, the device surface of the wafer was covered with a protective soap of silicon dioxide, and the specimen annealed at 1300° C. for six hours in an inert atmosphere.

The final structure of the buried oxide layer is free of silicon inclusions, as are the interfaces, which form sharp separations between the dielectric layer and the silicon wafer. In addition, the defect density in the overlying silicon body is less than $10^4$ defects per square centimeter.

The method of the present invention is a cost-effective method of producing SIMOX substrates of superior quality which are substantially free of silicon inclusions. The protocol involves a substantial reduction in the implantation protocol and reduces undesired damage to the overlying silicon body.

What is claimed is:

1. A method of producing a buried insulating layer in a silicon substrate comprising the steps of
   A. implanting a subcritical dose of at least one first ion species into said substrate to induce a controlled amount of damage to regions of the silicon lattice within a subsurface layer;
   B. creating nucleation sites in the damaged silicon lattice within said subsurface layer by heating the substrate following ion implantation to enlarge the damaged regions;
   C. implanting oxygen ions into said subsurface layer following the creation of the nucleation sites to deliver a total oxygen dose to the substrate less than $1.5 \times 10^{18}$ ions/cm$^2$; and
   D. annealing said substrate to form a buried layer of silicon dioxide in said silicon substrate.

2. The method of claim 1 wherein said first ion species comprises oxygen ions.

3. The method of claim 1 wherein said first ion species is selected from the group consisting of argon and silicon.

4. The method of claim 1 wherein said nucleation sites are formed by heating said substrate at a temperature of about 700–800° C. for about 10–20 hours.

5. The method of claim 4 wherein sad substrate is heated at about 800° C. for about 20 hours.

6. The method of claim 1 wherein said first ion species is implanted at a dose of about $10^{16}$ to $10^{17}$ ions/cm$^2$.

7. The method of claim 1 wherein said oxygen ions are implanted at a dose of about $10^{17}$ to $10^{18}$ ions/cm$^2$.

8. The method of claim 1 wherein said first ion species are implanted at a substrate temperature within the range of about 400°–450° C.

9. The method of claim 1 wherein said oxygen ions are implanted at a substrate temperature within the range of about 600°–750° C.

10. The method of claim 1 wherein said annealing temperature is within the range of about 1100°–1400° C.

11. The method of claim 10 wherein said annealing temperature is within the range of about 1300°–1350° C.

12. The method of claim 1 wherein said oxygen ions are implanted with an increasing ion beam energy.

13. The method of claim 12 wherein said ion beam energy is increased continuously.

14. The method of claim 12 wherein said ion beam energy is increased in multiple, discrete steps.

* * * * *